United States Patent [19]
Calafut et al.

[11] Patent Number: 5,767,550
[45] Date of Patent: Jun. 16, 1998

[54] INTEGRATED ZENER DIODE OVERVOLTAGE PROTECTION STRUCTURES IN POWER DMOS DEVICE APPLICATIONS

[75] Inventors: Daniel Calafut, Sunnyvale; Izak Bencuya, San Jose; Steven Sapp, Felton, all of Calif.

[73] Assignee: National Semiconductor Corporation, Santa Clara, Calif.

[21] Appl. No.: 731,598

[22] Filed: Oct. 16, 1996

Related U.S. Application Data

[62] Division of Ser. No. 631,080, Apr. 12, 1996, Pat. No. 5,602,046.

[51] Int. Cl.[6] .................................................. H01L 23/62
[52] U.S. Cl. .......................... 257/355; 257/356; 257/409; 257/488
[58] Field of Search .......................... 257/355, 356, 257/357, 340, 335, 337, 603, 409, 488

[56] References Cited

U.S. PATENT DOCUMENTS

| | | | |
|---|---|---|---|
| 4,437,107 | 3/1984 | Jonsson et al. | 257/603 |
| 4,798,810 | 1/1989 | Blanchard et al. | 437/29 |
| 4,892,836 | 1/1990 | Andreini et al. | 437/29 |
| 4,904,614 | 2/1990 | Fisher et al. | 437/41 |
| 4,990,976 | 2/1991 | Hattori | 257/355 |
| 5,077,590 | 12/1991 | Fujihara | 257/603 |
| 5,204,988 | 4/1993 | Sakurai | 257/356 |
| 5,324,971 | 6/1994 | Notley | 257/356 |
| 5,418,383 | 5/1995 | Takagi et al. | 257/48 |
| 5,432,371 | 7/1995 | Denner et al. | 257/409 |
| 5,468,984 | 11/1995 | Efland et al. | 257/356 |
| 5,514,608 | 5/1996 | Williams et al. | 437/44 |
| 5,536,958 | 7/1996 | Shen et al. | 257/355 |
| 5,557,127 | 9/1996 | Ajit et al. | 257/355 |
| 5,561,313 | 10/1996 | Saitoh et al. | 257/355 |
| 5,610,425 | 3/1997 | Quigley et al. | 257/358 |
| 5,612,564 | 3/1997 | Fujishima et al. | 257/603 |

OTHER PUBLICATIONS

IBM Technical Disclosure Bulletin, vol. 19, No. 5, Oct. 1976, PP. 1782–1783.

Stephen P. Robb, Judith L. Sutor and Lewis E. Terry, "SMARTDISCRETES™, New Products For Automotive Applications", 1989 IEEE, pp. 109–113.

H.C. De Graaff and M. Huybers, "Grain Boundary States and the Characteristics of Lateral Polysilicon Diodes", Solid State Electronics, vol. 25, No. 1, pp. 67–71, 1982.

*Primary Examiner*—Tom Thomas
*Assistant Examiner*—David B. Hardy
*Attorney, Agent, or Firm*—Limbach & Limbach L.L.P.

[57] ABSTRACT

In one embodiment, modifications to the polysilicon gate, body, source, and contact masks of a DMOS process add a source-body monocrystalline gate protection diode under the gate pad by implanting an anode region beneath the gate. The anode is connected to the gate through the gate metal in the pad. In addition to the gate-source diode, there is also a connection from the drain to the gate through the anode formed by the body region beneath the gate. This embodiment includes a junction terminating field plate. The presence of the field plate creates a special protection device similar to a zener diode, but which exhibits a current/voltage characteristic similar to a thyristor. A significant feature of this embodiment is that the zener breakdown voltage is easily adjusted by a simple modification to the fabrication process. The field plate creates two opposing junctions with the spacing determined by the length of the field plate. The concentration gradients under the field plate, and hence the breakdown voltage, is controlled by suitable length of the field plate and other processing conditions. A zener breakdown programmability option is implemented so that the zener breakdown voltage is varied by suitable process selection using only one additional implant, temperature cycle, and photolithographic mask. The zener diode gate protection structure formed using the field plate has a high current per unit power; therefore, a much smaller protection structure can be implemented compared to the prior art, because much more current is conducted for a given size structure.

12 Claims, 12 Drawing Sheets

INTEGRATED ZENER DIODE OVERVOLTAGE PROTECTION STRUCTURES IN POWER DMOS DEVICE APPLICATIONS

This is a divisional of application Ser. No. 08/631,080, filed Apr. 12, 1996, now U.S. Pat. No. 5,602,046.

BACKGROUND OF THE INVENTION

1. Field of the Invention

The present invention relates to the field of Electro-Static Discharge and overdrive gate protection circuits for MOSFET circuits. Specifically, the present invention relates to zener diode and thyristor gate protection circuits and is described in the context of a DMOS power device.

2. Discussion of the Related Art

Electrostatic Discharge (ESD) presents a special problem for semiconductor devices and particularly for metal oxide semiconductor (MOS) types of structures. The high voltage transient signal from a static discharge can bias an object with more than 10,000 Volts. The unique hazard in MOS devices is the high electric field that can develop across a relatively thin gate dielectric used in the normal course of operation of the device. The gate dielectric, which is often oxide, can rupture under high electric field conditions, when the charge built up on the gate penetrates the gate oxide which normally acts as an insulator. The effects of the permanent damage caused by the rupture may not be immediately apparent; therefore, the possibility of gate oxide rupture constitutes a realistic reliability concern.

Common power MOSFETs have no protection against ESD (electro-static discharge) or excessive voltage signals applied to the gate. Silicon dioxide ($SiO_2$) is often used as the gate dielectric in MOS devices. Typically, the rupture voltage for $SiO_2$ can be as high as 10,000,000 Volts per centimeter. Modern MOS devices may have operational gate oxide of 400 Å thickness. Therefore, the realistic rupture voltage for such a device is only about 40V. One of the primary causes of ESD is contact with the human body during product assembly or maintenance. The "human body model" for ESD conditions typically involves a resistor in series with a capacitor. The capacitor in the human body model is very large in comparison to the gate capacitance of the MOS power device, which typically have higher gate capacitances than other types of MOS devices. Thus, the human body appears to the power device as a high voltage battery during an ESD event.

Because ESD conditions are common in many working environments, many commercial MOS devices are equipped with self-contained ESD protection systems. These can be discrete or integrated with the main functional circuitry.

One method for protecting the gate of the devices from voltage above the oxide breakdown employs back-to-back diodes constructed in the polysilicon gate and then connected to the source. This method is effective in improving the ESD rating of the MOSFET gate, and for avoiding over voltage damage; however, gate-source leakage current increases significantly since diodes constructed in polysilicon have much greater leakage current than in monocrystalline silicon. Maximum gate leakage current typically increases from 100 nanoamps to 10 microamps using this method. Some manufacturers have constructed other components in conjunction with the polysilicon diodes thus adding some limited control functions such as over current protection.

An example of a typical ESD protection structure commonly implemented on a CMOS IC is shown in FIG. 1. In the circuit of FIG. 1, a large invertor is formed by the N-channel MOS 101 and the P-channel MOS 102. Zener diodes 103 and 104 protect the gates of the power transistors 101 and 102 from very high voltages; zener diodes 105 and 106 protect the gates from very low voltages. Each zener diode pair is configured to point in opposite directions so that for current to flow in either direction across the pair, one zener breakdown voltage (plus one forward-biased diode drop) must be incurred. The reverse breakdown voltage in a zener diode is dependent upon the characteristics of the diode, but is typically much higher (on the order of several volts to tens of volts) than the forward-biased diode (on the order of 0.6 to 0.8 Volts). For extremely high positive or negative voltages, both diode pairs may conduct until the input voltage reaches a sufficiently low positive or negative voltage so as to cause one of the pairs to turn off. The pair 105 and 106 will turn off first for high positive voltages, while the pair 103 and 104 will turn off first for high negative voltages. The diode pair that remains on will continue to conduct until the input voltage reaches an even lower positive or negative voltage so that none of the protection diodes is turned on. The zener diodes are fabricated such that their reverse breakdown voltage plus one forward-biased diode drop is less than the rupture voltage for either power transistor 101 or 102.

Polysilicon diodes are sometimes used for ESD protection on the gates of power devices. FIG. 2 illustrates one way to fabricate a polysilicon zener diode protection circuit such as shown by elements 103 and 104 in FIG. 1. The source metal 201 connects to a series of polysilicon regions alternately doped as N and P type. The gate metal 202 connects to one of the polysilicon regions at the end of the series. The source metal 201 is insulated from the drain 203 which is the N-epitaxial layer by a thin layer of gate oxide 204. Thick field oxide 205 insulates the back to back diode series and the gate metal from the N− drain 203.

However, the use of polysilicon to produce a diode suitable for ESD protection circuitry has the disadvantage that the diodes are leaky, thus a substantial leakage current may result. In addition, the fabrication process for polysilicon diodes is somewhat complicated. Moreover, the current-voltage characteristic of the polysilicon diodes is a monotonic function having no "snap back" or thyristor-like behavior. In other words, even after breakdown occurs, a high voltage must be maintained across the junctions in order to maintain the current. Because a high voltage is required in order to keep the diodes in a conduction state, a low current to power ratio is achieved. In other words, because prior art structures for ESD protection include polysilicon diodes which inherently have high leakage currents, increased ESD protection requires increased power dissipation in those prior art devices.

DMOS (Double Diffused MOS) transistors are a type of MOSFET (Metal On Semiconductor Field Effect Transistor) using diffusion to form the transistor channel regions. The typical application for DMOS transistors are as power transistors. In order to provide high voltage circuits for power integrated circuit applications, DMOS is presently the device of choice. DMOS transistors are widely used in applications which require high power capabilities. DMOS transistors provide the higher current per unit area when low forward voltage drops are desired.

In a typical discrete DMOS circuit, several DMOS transistors are fabricated in parallel. Therefore, on a typical discrete DMOS semiconductor, the DMOS devices share a common drain contact (the substrate), their sources are all shorted together with metal, and their gates are shorted together with polysilicon. The discrete DMOS semiconductor thus behaves as if it were one large transistor, even though it is often physically constructed using an array or matrix of smaller transistors all connected in parallel. For a discrete DMOS semiconductor, it is desirable to maximize the conductivity per unit area of DMOS transistor array when it is turned "on" by the gate.

One of the new application trends for DMOS technology is in power management and switching in battery operated circuits such as portable computers and cellular telephones. One of the significant requirements in future circuits is to reduce power consumption and thus extend the time between battery charging cycles. New circuits are using lower voltage integrated circuits that have supply voltages of 3.3 volts and less to reduce the demand on the batteries. The MOSFET components are used to shut down power to unutilized circuits and drive transceivers. To keep pace with the decreasing power supply trends, the MOSFET components must be capable of operating at lower gate drive conditions. If the MOSFET will no longer be driven up to 10 volts, the need for high gate voltage ratings becomes unnecessary except to limit ESD susceptibility.

In one typical prior art process, both the channel and heavy body diffusions are placed under the gate bond pad as in FIG. 4. The interlayer dielectric is continuous under the pad to minimize gate-source and gate-drain capacitance. The gate metal only contacts the polysilicon gate around the gate pad periphery or in the gate busses or runners.

FIG. 4 illustrates a normal gate bond pad structure and the edge of the DMOS array having no ESD protection. The N+ regions 401 and 402 are source regions which are connected to source metal. (The connection of the source metal 403 to the N+ source region 401 is not shown.) The gate metal pad 404 is insulated by interlayer dielectric and is connected to the gate polysilicon 406 in a part of the chip not illustrated in FIG. 4. FIG. 5 illustrates a typical N-channel DMOS circuit element realized by the structure of FIG. 4, for example.

While it is possible to incorporate the diode structure into the polysilicon without additional mask steps, it is likely that, in order to achieve the best possible performance of both the MOSFET and its gate protection diodes, additional masking steps would be preferred.

Utilizing modern state-of-the-art smart power technologies it is possible to have very sophisticated gate protection schemes. Smart power products are power devices which incorporate a few small signal devices on the chip with little or no added process complexity in order to provide protection and diagnostic functions to the power device with very little additional cost. These technologies can integrate a wide variety of CMOS control elements with multiple DMOS output devices. Other smart power technologies use lateral DMOS structures to accomplish the required integration. However, most of these process technologies require double the number of masking operations, compared to discrete devices, to achieve the desired control structures. Because the cost of a chip is in part a function of the number of masking steps necessary in fabrication, the cost per unit area of silicon is significantly higher using these processes which require a greatly increased number of masks to implement the gate protection devices.

In addition, excessive voltage applied to the drain, as in inductive switching applications, in which no external drain voltage protection has been provided, can often cause excessive heating or damage when the device dissipates the inductive energy while conducting the current across the diode 501 in FIG. 5 in avalanche breakdown.

As fabrication technology allows increasing further miniaturization of the semiconductor features, the gate oxide becomes thinner; therefore, MOSFET devices will become more prone to ESD damage and voltage transients on the gate. Thus, there is an increasing need for effective gate protection mechanisms. Therefore, it is desirable to produce a gate protection mechanism having low process complexity, having very little or no leakage current, and providing a high current carrying capability (high current to power ratio) even at relatively low voltages.

SUMMARY OF THE INVENTION

An object of the present invention is to produce a gate protection structure in monocrystalline silicon for a MOS device which consists of a zener diode with a junction terminating field plate. Another object is to produce a protection structure having a thyristor-like current/voltage characteristic. Yet another object is to produce a gate protection structure in monocrystalline silicon for a MOS device which adds no additional steps to the fabrication of the MOS device.

In one embodiment of the present invention, modifications to the polysilicon gate, heavy body, source, and contact masks add a protection diode which is terminated by a field plate. The anode is connected to the gate through the gate metal in the pad. Several of these diodes can be fabricated in parallel. In addition to the gate-source diode, there is also a connection from the drain to the gate through the common anode formed of the gate protection diode.

The field plate creates two opposing junctions with spacing determined by the length of the field plate. Because the nature of these junctions is determined by a gaussian distribution, the concentration gradients under the field plate, and hence the breakdown voltage Vz, is controlled by a suitable process selection. Only one additional implant, temperature cycle, and photolithographic mask are added to the standard MOS process in order to implement the programming option. Alternatively, the zener breakdown voltage can be predesigned into the existing MOS masks, thereby implementing the protection circuit with no additional processing steps over a standard process.

When the zener diode experiences reverse breakdown, a very large current can be conducted at a very low voltage. In the case that an electrostatic discharge (ESD) event occurs during a discharging of the human body, eventually the capacitance of the human body is discharged and the diode turns off. The zener diode gate protection structure formed using the field plate has a high current per unit power; therefore, a much smaller protection structure can be implemented compared to the prior art, because much more current is conducted for a given size structure.

These and other features and advantages of the embodiments of the present invention will become apparent from the detailed description of the invention and the drawings, in which like numerals represent like parts.

BRIEF DESCRIPTION OF THE DRAWINGS

In the figures, like parts are referenced using the same numerals.

DETAILED DESCRIPTION OF THE INVENTION

The present invention is very effective in eliminating the problems discussed above while not impacting component cost or power consumption in the MOSFET. The present invention includes structures and methods for protecting integrated circuit devices from damaging signals applied to the device. The present invention is illustratively applied to vertical DMOS (double diffused MOS) structures. The structures and processes according to the present invention can be part of any CMOS/BiCMOS process flow, but because the protected circuitry in the typical application of this invention is a power device, the implementations of the present invention will be discussed in terms of a DMOS process flow. The circuit equivalent for a typical N-channel power DMOS FET power device is therefore illustrated in FIG. 5.

Figure 6:
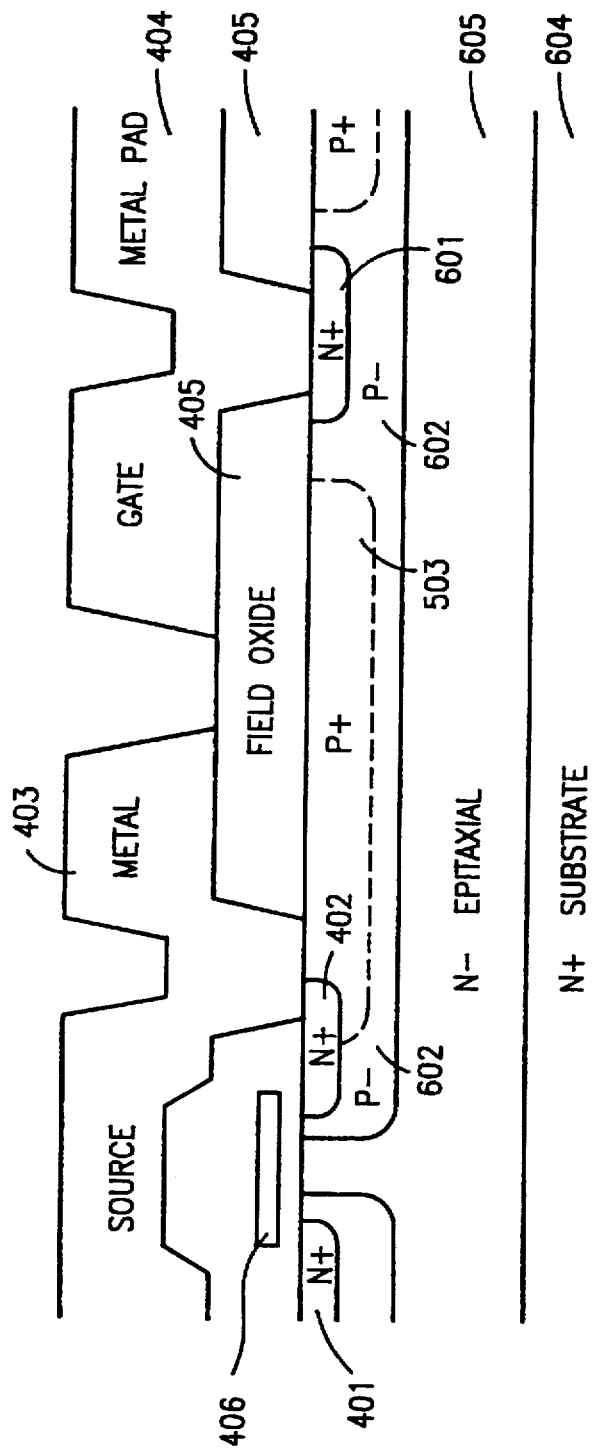
FIG. 6 illustrates the gate pad structure and DMOS transistor including a zener diode protection structure according to an embodiment of the present invention.

According to one embodiment of the present invention, as illustrated in FIG. 6, modifications to the heavy body, source, and contact masks adds a source-body zener diode under the gate pad which is connected to the gate through the gate metal 404 in the pad. The N+ region 601 forms the cathode of the diode, while the p+ body contact region 602 forms the anode of the diode. Several of these diodes can be fabricated in parallel.

In addition to the gate-source diode, there is also a connection from the drain 604 to the gate through the N+P– diode formed by the body region 602 (cathode) beneath the N+ region 601 (anode). The connection of the P– body region 602 to the N– epitaxial region 605 creates another PN junction. The resulting circuit is much like a bipolar transistor in which the emitter is the gate N+ region 601, the base is the P– body region 602, and the drain 605 is the collector.

Figure 7:
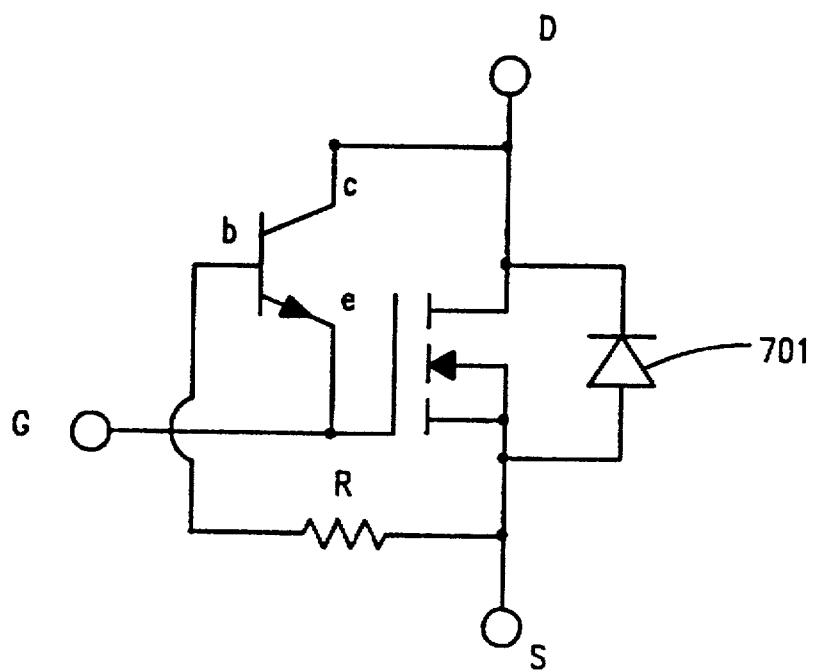
FIG. 7 illustrates a circuit model for the DMOS transistor and zener diode gate protection structure according to the embodiments of the present invention.

The resulting circuit is illustrated in FIG. 7. This structure offers some interesting circuit possibilities. Not only does the emitter-base diode protect the gate from excessive voltage and ESD, but the collector-base-emitter path provides a feedback loop to the gate of the MOSFET. If the drain voltage rises above the collector-emitter break down voltage of the transistor, charge will be pumped into the gate of the MOSFET thus driving it to invert a channel creating a low impedance path from drain to source. In unclamped inductive switching circuits, the result is a much more robust MOSFET since it can handle higher current while remaining in the "ON" state rather than resorting to avalanche breakdown as would occur in a prior art device.

Figure 1:
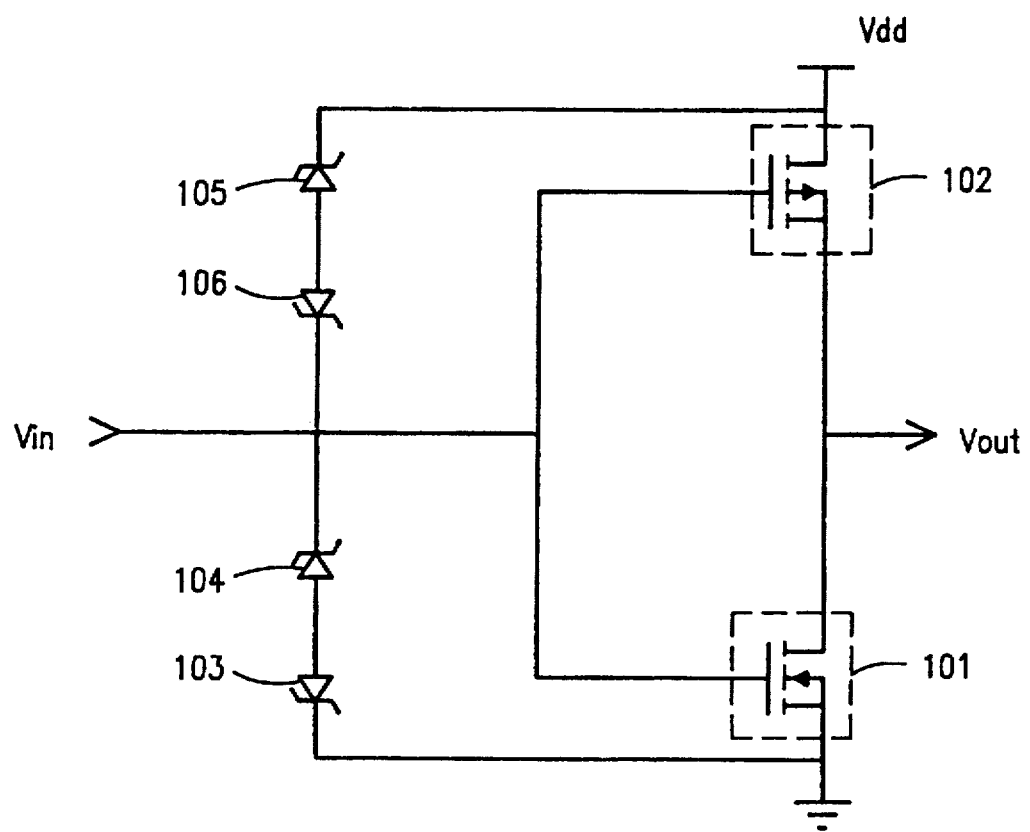
FIG. 1 illustrates a power invertor with a typical prior art input gate protection mechanism using back to back zener diodes.
Figure 2:
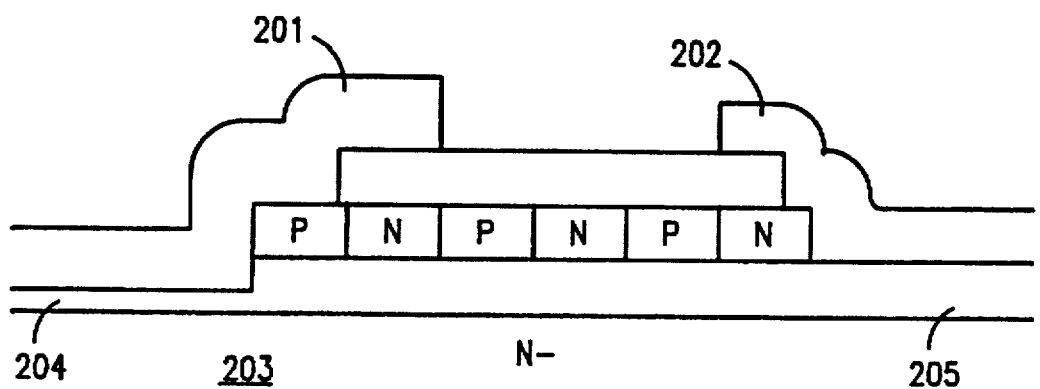
FIG. 2 illustrates a prior art semiconductor structure implementing the back to back zener diodes illustrated in FIG. 1 in a polysilicon layer.
Figure 3:
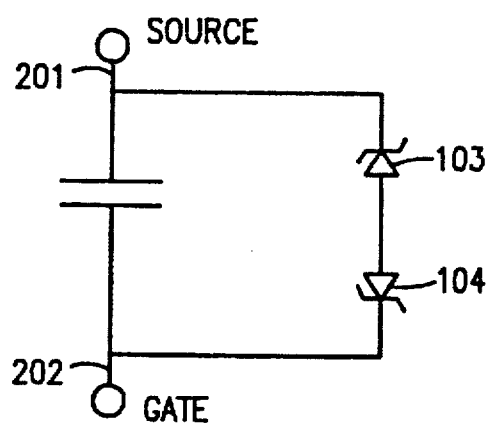
FIG. 3 illustrates the circuit equivalent of the structure illustrated in FIG. 2.
Figure 4:
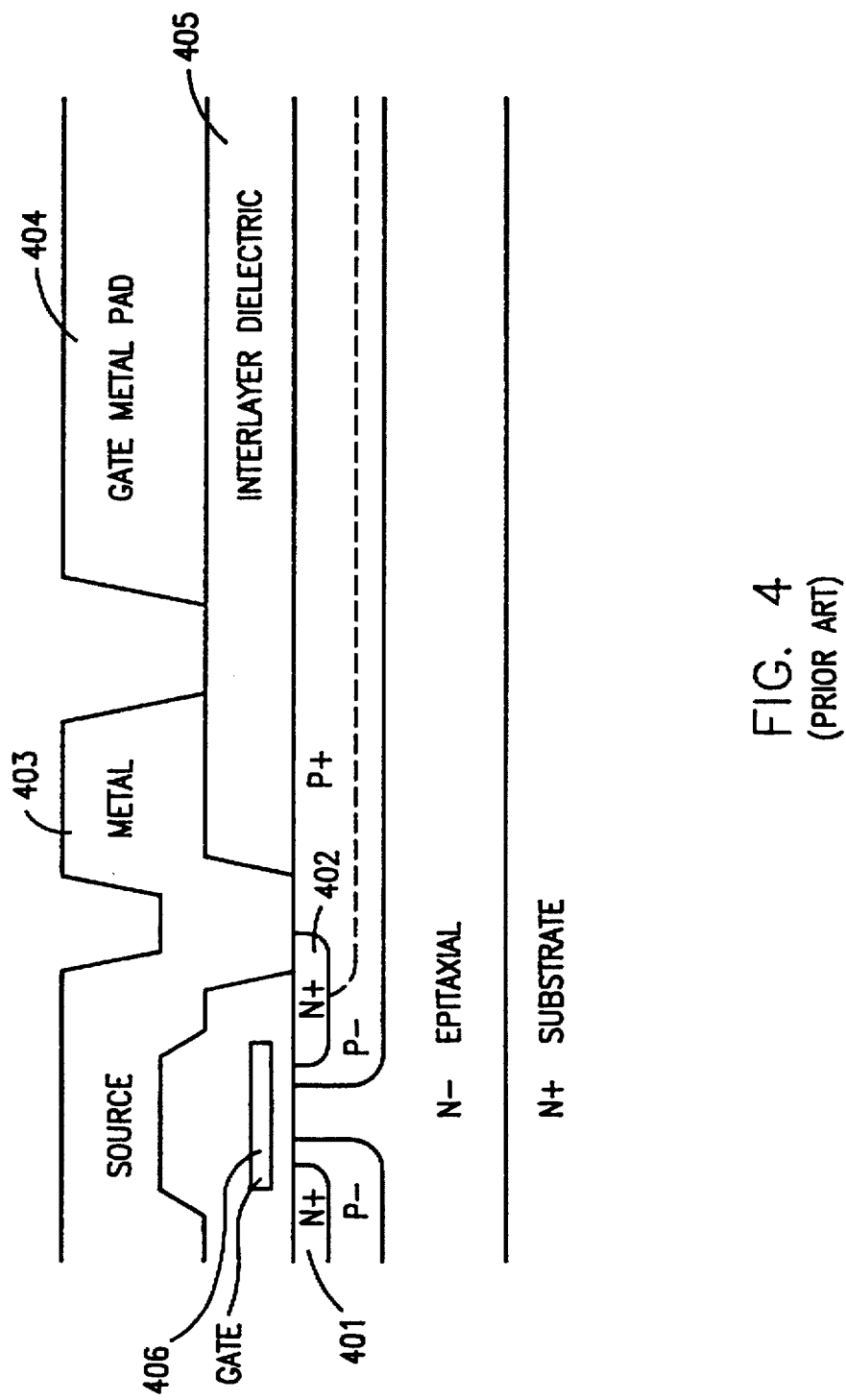
FIG. 4 illustrates a prior art gate pad structure and DMOS (double diffused MOS) transistor at the edge of a DMOS array in a power device.
Figure 5:
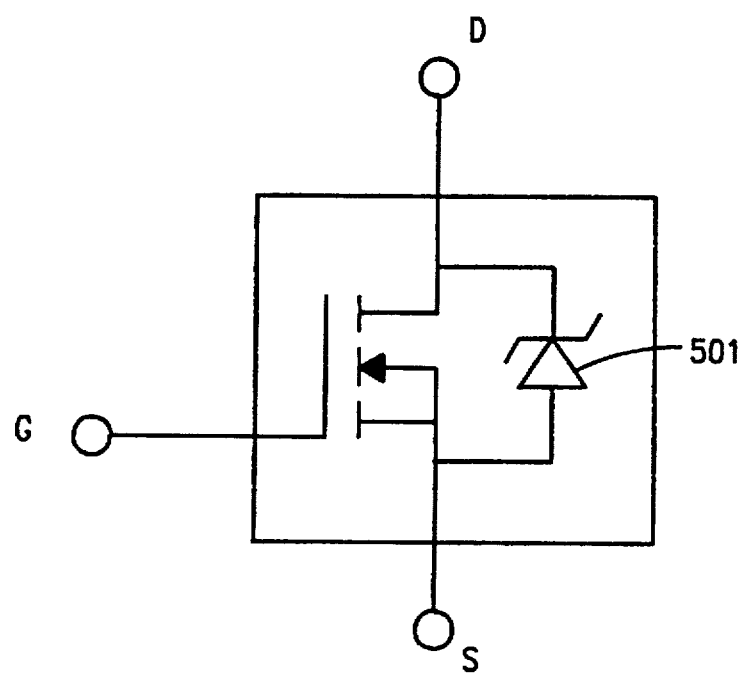
FIG. 5 depicts a standard circuit symbol for an N-channel DMOS power device.

FIG. 5 shows that a typical N-channel DMOS device includes a zener diode 501 from drain to source which breaks down when the drain to source voltage exceeds the a specified voltage value. Considering the equivalent circuit of the DMOS device with the zener protection element in FIG. 7, avalanche current in the body zener diode 701 can be injected into the gate through the collector of the bipolar device and turn on the MOS device which will shunt some of the current carried by the body diode. This action helps to improve the ruggedness of the device.

Unlike the polysilicon diode or smart power methods for drain and gate over voltage protection, the fabrication of the structure according to the present invention does not require any additional masking or diffusion operations. Instead, it uses the same junctions already in the DMOS structure. The only changes required are some minor layout modification on three masking layers. One drawback of the circuit according to this embodiment is that the emitter-base reverse breakdown voltage of the bipolar structure is only about 7 to 9 volts. This limits the maximum gate voltage thus limiting the gate overdrive potential, which consequentially limits the drain saturation current and increases the minimum ON state resistance at the maximum gate drive voltage. However, a suitable application for this embodiment is 3.3 volt logic driving the gate; therefore, the limited gate voltage would not be problematic.

Even if the emitter-base breakdown voltage is exceeded the MOSFET will not be damaged unless excessive heat in the diode causes failure. The gate could therefore be driven above the maximum voltage of this zener diode with the gate current only being limited by power dissipation concerns in the zener or by the current compliance of the gate driver.

Figure 8:
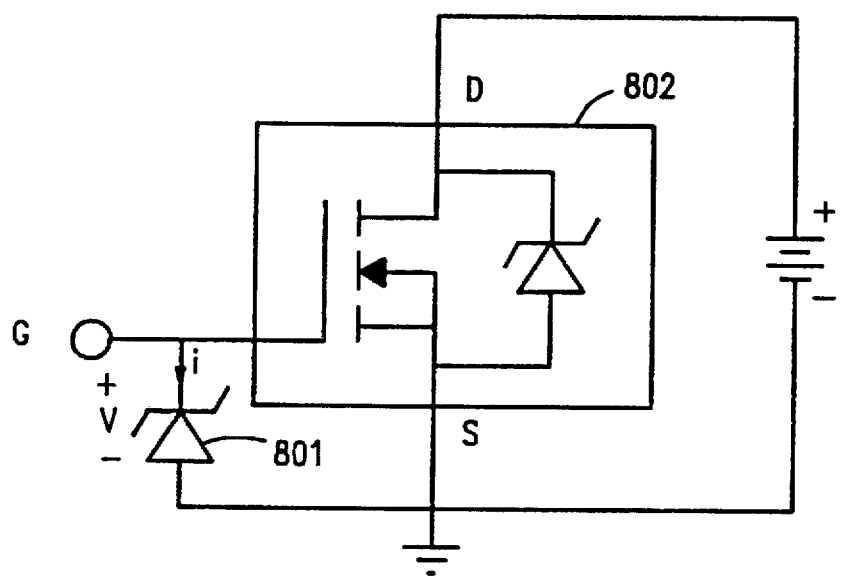
FIG. 8 depicts the circuit configuration of the zener diode gate protection mechanisms according to the embodiments of the present invention.
Figure 9:
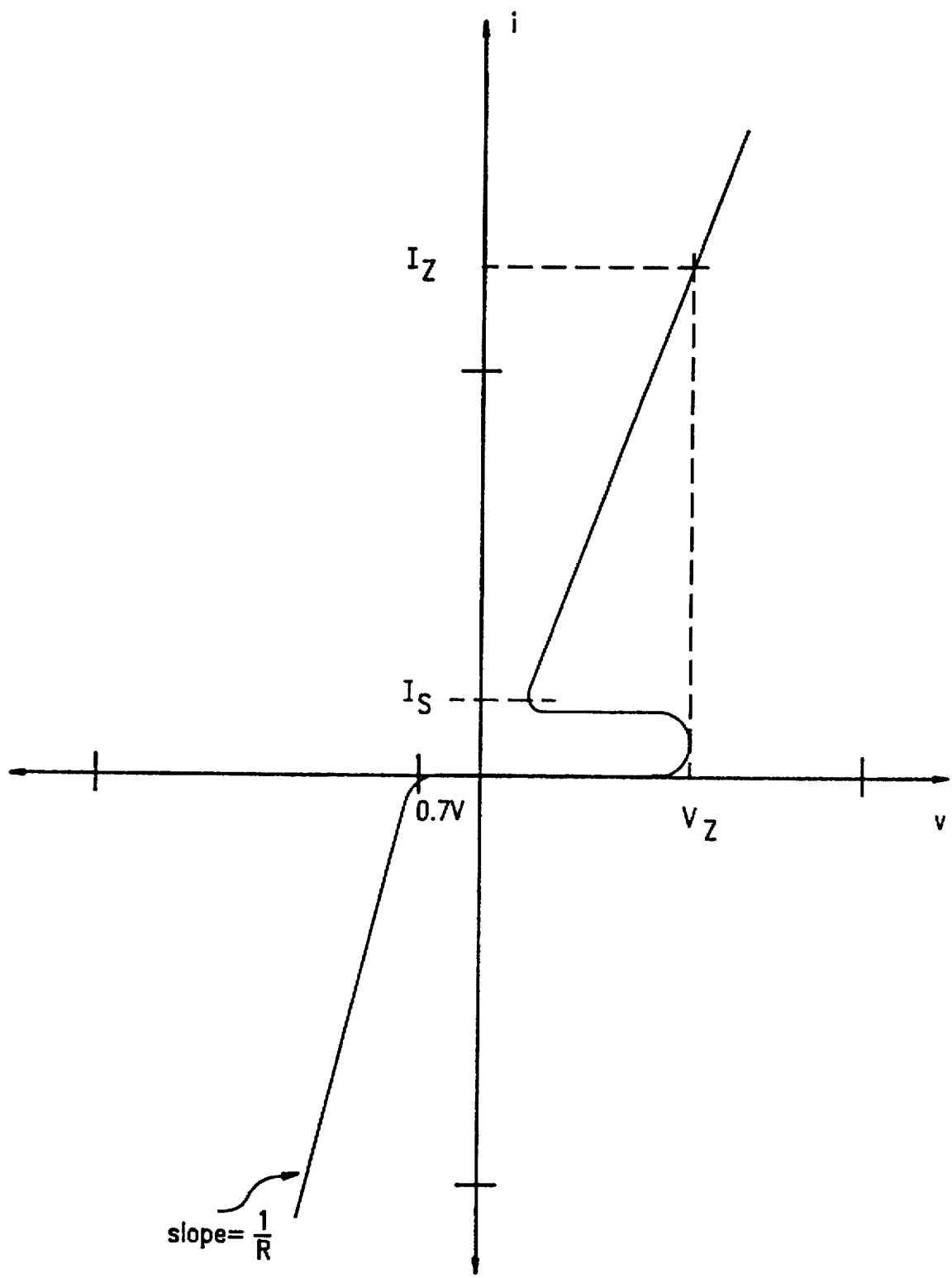
FIG. 9 is a current versus voltage plot of the zener diode gate protection device according to another embodiment of the present invention.

According to another embodiment of the present invention, a special protection device similar to a zener diode is implemented, as illustrated in FIG. 8. The special protection device 801 illustrated in FIG. 8 is similar to a zener diode, but behaves much like a thyristor. FIG. 9 is a current versus voltage plot of the behavior of the special protection device 801 (referred to as a zener diode) according to this embodiment of the present invention. At normal positive operating gate voltages, the diode 801 is non-conductive. However, upon reaching a predetermined zener voltage Vz, the circuit element 801 begins to conduct. The zener voltage Vz is designed to be lower than the gate rupture voltage of the power transistor 802 illustrated in FIG. 8. After the diode 801 starts conducting, it snaps back so as to conduct a much higher current at a much lower voltage, as illustrated by the curve in the first quadrant of the i-v plot in FIG. 9.

This is ideal behavior for ESD and over voltage gate protection, because the reduction in voltage in the first quadrant coupled with the increase in current provides a high discharge current per unit power dissipation. If the current were monotonically related to the voltage, as in the other embodiment and in the prior art, then the power dissipation would increase as the discharge current increased. The increase in power causes heating in the circuit. If the heating is too great, the circuit can be permanently damaged. By decreasing the power per unit discharge current, a smaller discharge circuit can be used according to this embodiment of the present invention. Another significant feature of this embodiment is that the zener breakdown voltage Vz can be easily adjusted by a simple modification to the fabrication process.

Figure 10:
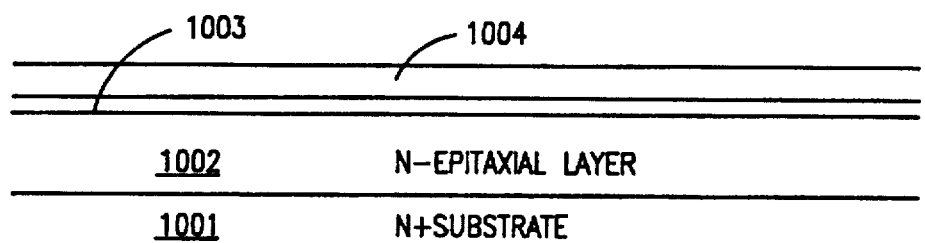
FIG. 10 illustrates the initial layer formations used in the fabrication of the gate protection structure according to the embodiment of the present invention realizing the characteristic shown in FIG. 9 in a DMOS circuit.

The primary process steps for fabricating this device are shown in FIGS. 10 through 15. Referring to FIG. 10, the process flow begins with an N+ substrate 1001. An N-epitaxial layer 1002 is grown on the N+ substrate 1001. A gate oxidation step is performed to produce a thin gate oxide film 1003 on the N– layer 1002 of approximately 400 Angstroms. A doped polysilicon layer 1004 of approximately 5,500 Angstroms is then deposited on the gate oxide layer 1003.

Figure 11:
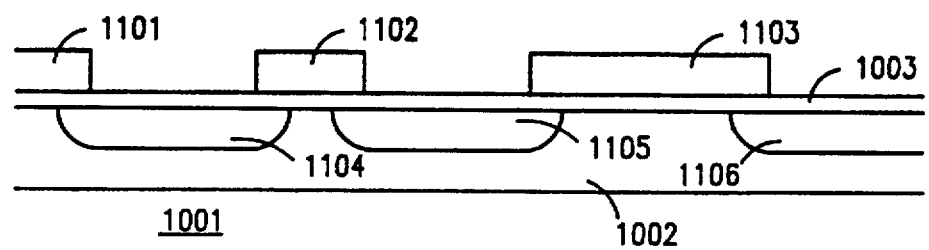
FIG. 11 illustrates the gate, field plate, and body formations used in the fabrication of the gate protection structure according to the embodiment of the present invention realizing the characteristic shown in FIG. 9 in a DMOS circuit.

Referring to FIG. 11, a photoresist mask (not shown) is deposited on the polysilicon so as to protect the DMOS gates 1101 and 1102 and the field plate 1103 during a subsequent anisotropic (dry) etch. The etch is performed down to the gate oxide 1003. A Boron implantation is performed in order to form the p– body regions. This implantation can be performed either before or after the removal of the photoresist mask. A thermal drive-in step then laterally and vertically diffuses the implanted P type impurity throughout the body regions 1104, 1105, and 1106. The structure now looks as illustrated in FIG. 11.

Figure 12:
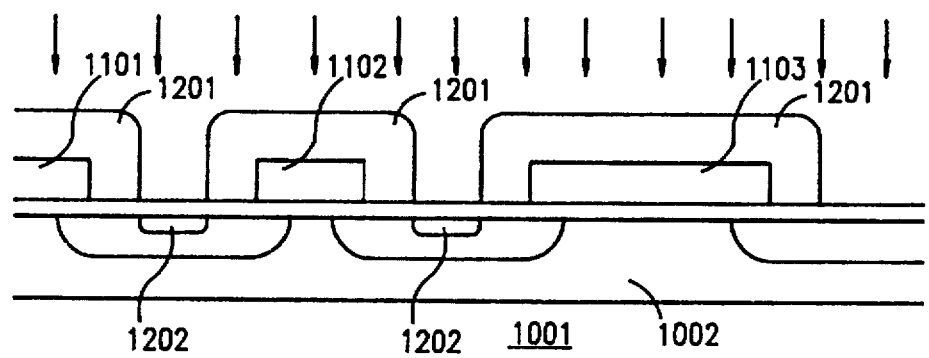
FIG. 12 illustrates the heavy body contact formation used in the fabrication of the gate protection structure according to the embodiment of the present invention realizing the characteristic shown in FIG. 9 in a DMOS circuit.

Referring to FIG. 12, a photoresist mask 1201 is deposited over the gates 1101 and 1102, the field plate 1103, and the gate pad area. A second P+ Boron implantation is performed in order to form the body contact regions 1202.

Figure 13:
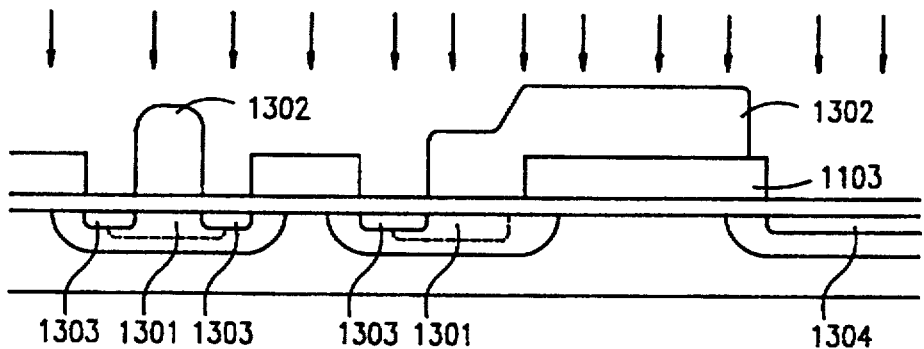
FIG. 13 illustrates the source and zener cathode implantations used in the fabrication of the gate protection structure according to the embodiment of the present invention in a DMOS circuit realizing the characteristic shown in FIG. 9.

Then the photoresist mask 1201 is removed, and a thermal drive-in step is performed in order to diffuse the P+ body contact regions 1301 as shown in FIG. 13.

Referring to FIG. 13, a photoresist mask 1302 is deposited which protects the P+ body contact regions 1301 and the field plate 1103. An N+ Arsenic implantation is performed to form the DMOS source regions 1303 and the zener diode cathode 1304.

The photoresist mask 1302 is then stripped away. A thermal diffusion step causes vertical and lateral diffusion of the N+ source regions 1303 and the zener cathode 1304 to create the N+ source regions 1401 and the zener cathode 1402.

A dielectric interlayer is then deposited over the entire surface. Typically, this is BPSG (Borophosphosilicate glass) or PSG (phosphosilicate glass). The contact area and gate pad areas are defined by another photolithographic mask.

Figure 14:
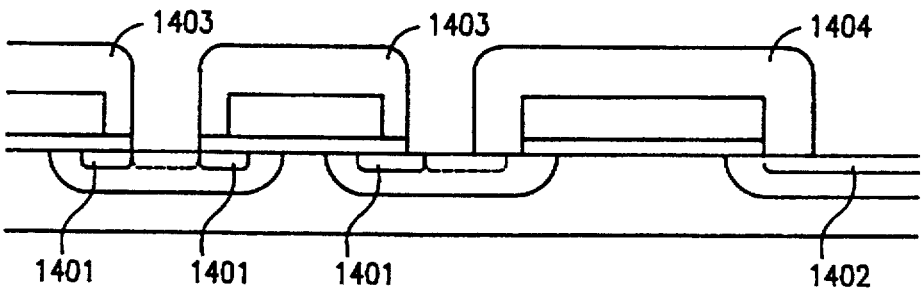
FIG. 14 illustrates the gate and field plate insulation formations used in the fabrication of the gate protection structure according to the embodiment of the present invention realizing the characteristic shown in FIG. 9 in a DMOS circuit.

Referring to FIG. 14, the contact and pad openings are etched away, leaving the gate insulators 1403 and the field plate insulator 1404, while the remaining insulators, including the gate oxide in the exposed areas, are etched back to the epitaxial layer surface.

A blanket deposition of metal (Aluminum) is then performed over the entire semiconductor surface. Another photolithographic mask is then deposited over the metal layer so as to expose an area above the field plate.

Figure 15:
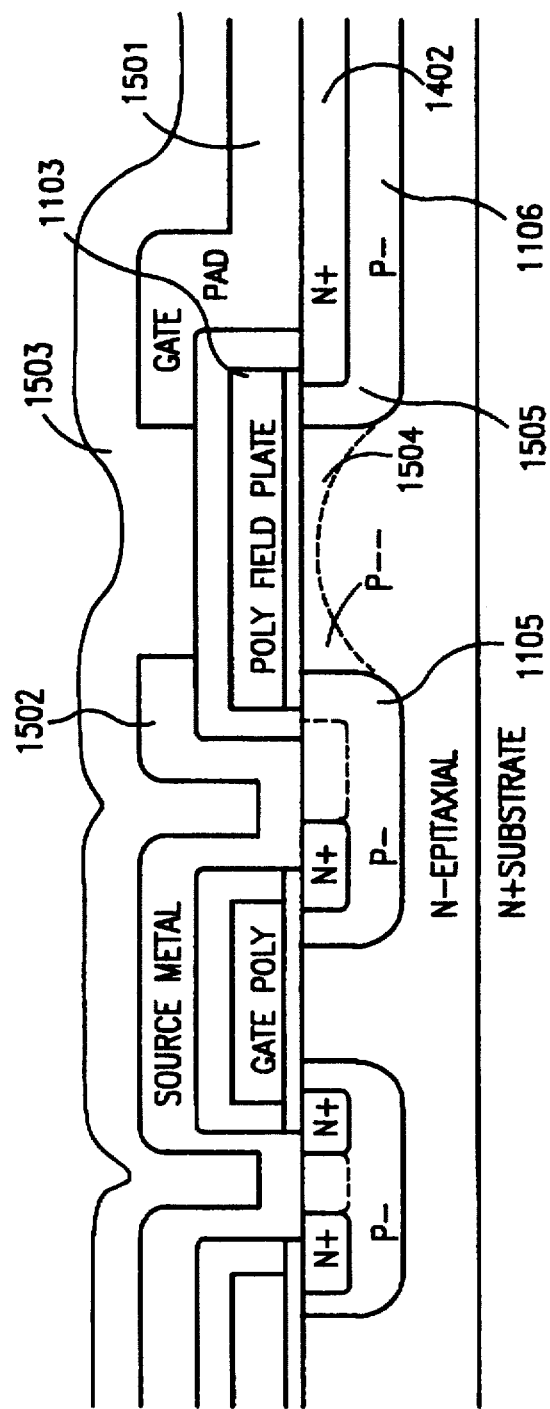
FIG. 15 illustrates a finished gate protection structure according to the embodiment of the present invention realizing the characteristic shown in FIG. 9 in a DMOS circuit.

Referring to FIG. 15, the metal over the field plate in the exposed area is etched back to the insulator surface, thereby separating the gate pad 1501 from the source metal 1502. A passivation layer 1503 is finally deposited over the entire surface of the semiconductor.

Using this flow, a zener diode like element is formed in such a way as to have the cathode connected to the gate terminal and the anode is connected to the source terminal. This structure is shown in FIG. 15. (For a P-channel device, the terminal connection discussed above would be reversed.) The equivalent circuit is shown in FIG. 8. However, as discussed above, the zener diode 801 illustrated in FIG. 8 has a current-voltage characteristic as shown in FIG. 9. In order to achieve this characteristic, diffused junctions in the region 1504 beneath the field plate facilitate this operation.

There are two diodes related to the operation of this device. One is the zener diode used to establish the initial breakdown of the gate. This diode (D1) is formed between regions 601 and 602 of the structure in FIG. 6. In addition, there is a second diode involved in the operation of the device (D2) which is formed between regions 602 and 605 in the structure of FIG. 6. Diodes D1 and D2 share a common anode and therefore a common voltage under small current conditions. When large currents begin to flow from the cathode of D1 during gate breakdown, a potential drop exists between region 602 and 605 in the structure of FIG. 6. If this voltage rises above the drain potential by a value determined by the relative impurity concentrations in 602 and 605, D2 turns on. The turn-on voltage is loosely referred to as a "diode drop" and has values ranging from 0.5 Volts to 0.9 Volts in this type of application.

By forming the diffused junctions in monocrystalline silicon, complexities in the manufacturing, reliability, and operation of the device are eliminated as compared to prior art approaches using inherently leaky and unreliable polysilicon diodes. Referring to FIG. 15, a novel and interesting feature of the resulting structure according to this embodiment of the present invention is the polysilicon field plate 1103 which is discussed below in detail.

Figure 16A:
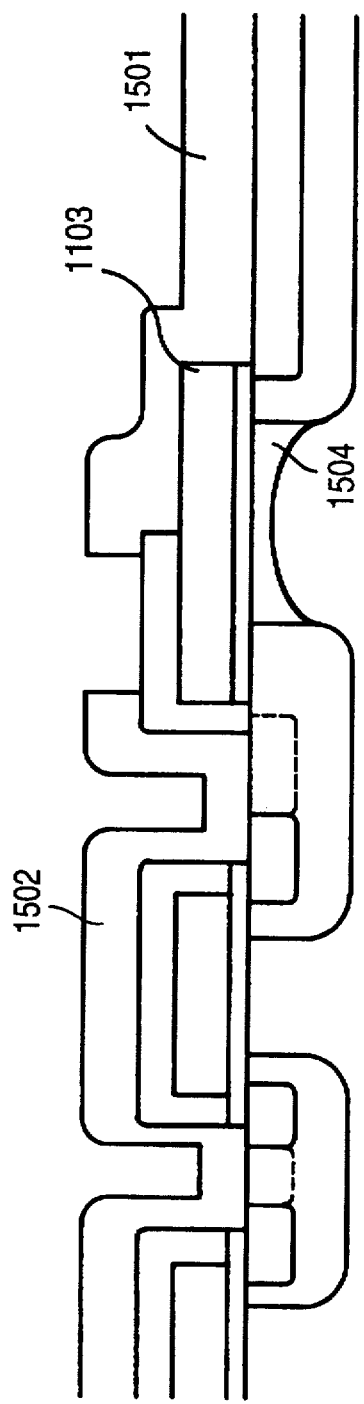
FIG. 16a illustrates another gate protection structure according to the present invention in which the field plate is electrically connected to the gate pad that implements the characteristic shown in FIG. 9 in a DMOS circuit.
Figure 16B:
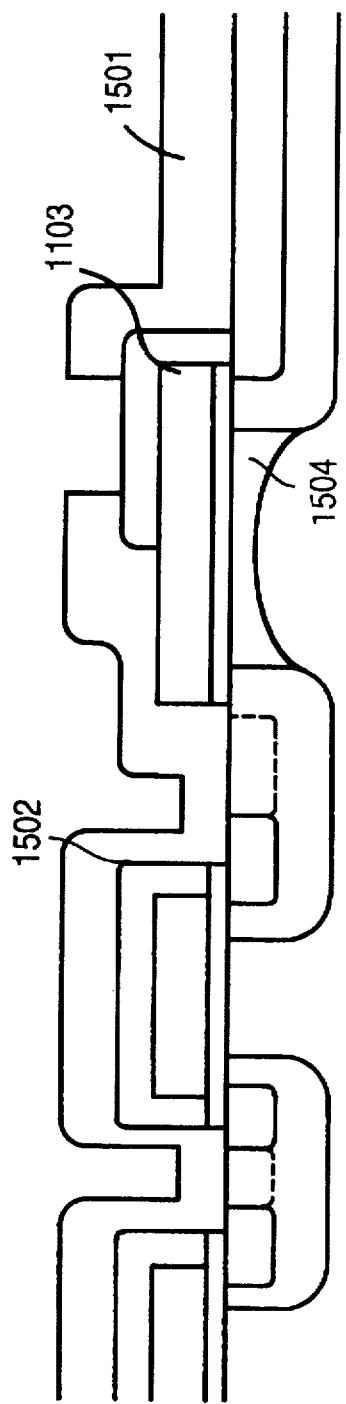
FIG. 16b illustrates another gate protection structure according to the present invention in which the field plate is electrically connected to the source metal.

FIG. 16a illustrates a resulting structure of this embodiment of the present invention, in which the field plate 1103 is connected to the gate pad metal 1501. The electrical connection of the field plate 1103 is immaterial to the function of the circuits according to the present invention. Thus, as illustrated in FIG. 16a, the field plate 1103 may be connected to the gate pad metal 1501 or, as illustrated in FIG. 16b, the field plate may be connected to the source metal 1502. Alternatively, the field plate 1103 may be left unconnected to any other circuit elements as in FIG. 15. Thus, the present invention involves the use of the field plate 1103 connected (or not connected) in any way to other parts of itself or parts of the main functional circuitry. Furthermore, the field plate may be fabricated of any type of conductive material. For example, the field plate can alternatively be made of metal (aluminum) according to the present invention, instead of polysilicon as illustrated in FIGS. 15, 16a and 16b.

The field plate creates two opposing junctions with the spacing determined by the length of the field plate. Because the nature of these junctions is determined by a gaussian distribution, the concentration gradients under the field plate, and hence the breakdown voltage Vz, can be controlled by a suitable length of the field plate and other processing conditions. Moreover, the said junctions flanking the field plate need not be identical and can occur in any separate parts of the process flow. This allows the zener diode to have a programming option in which the zener breakdown voltage can be varied by suitable process selection. In order to make the zener diode formation fully programmable, only one additional implant, temperature cycle, and photomask are added to the standard process outlined in FIGS. 10 through 15.

In order to implement a Vz breakdown programming option, an additional masking step is used to etch the polysilicon field plate 1103 illustrated in FIG. 11; therefore, separate masks are used for the formations of the DMOS gates 1101 and 1102 and for the formation of the field plate 1103. The formation of the field plate 1103 is performed using its own separate mask, and an implantation of the P− region 1106 may be performed through this mask. A separate temperature cycle may be performed specifically to form the zener junctions 1504 illustrated in FIG. 15. Then, the P− well implantations for the body regions 1104 and 1105 may be performed through the DMOS gate mask, which blocks etching over and implantation into the zener area or the gate pad area.

Referring back to FIG. 6 which shows one embodiment of the present invention, when the N+ diode implantation 601 is performed, it counterdopes (with a larger concentration) the P− implantation 602 which existed in that region prior to the N+ doping. The implantation of the N+ zener cathode into the P− heavy body contact 602 necessarily creates an abrupt, highly-doped P−N+ junction between the N+ region 601 and the P− region 602.

When a large gate voltage is applied to the gate pad 404 illustrated in FIG. 6, the N+ 601 to P− 602 diode becomes reverse biased. The depletion regions on both sides of the N+P− junction grow in width proportionally as the level of reverse bias increases. The widths of the depletion regions are also inversely proportional to the doping concentrations on either side of the junction; therefore, because the doping concentration of the N+ side 601 is high, the depletion region on the N+ side 601 is very narrow. Electric fields have units of volts per unit length; therefore, as a reverse bias voltage V is applied to the N+P− diode, the electric fields within the depletion regions are high because the widths of the depletion regions are small.

As the magnitude of the reverse bias increases, the electric field in the depletion region increases until at some point the electric field will be great enough to cause a rapid increase in the current. This can be due to either one of two mechanisms. The first, zener breakdown, occurs in heavily doped junctions where the depletion region is relatively narrow and the electric fields are very high. The electric fields become so large that electrons are pulled from their bonds, and with this concentration of carriers a large current can flow. The second mechanism is "avalanche" breakdown. This occurs when the few carriers crossing the depletion region in reverse bias gain enough energy so that when and if they collide with electrons in bonds, they will knock them loose. Each carrier hole and carrier electron pair created by this collision are accelerated by the high field and knock (on average) more than one additional carrier pairs loose. The resulting avalanche of carriers results in a very large current. Reverse breakdown by either mechanism need not damage the device. Unless there is excessive heating, reverse breakdown is fully reversible.

In the circuit of FIG. 6, zener breakdown occurs at approximately 7 to 9 volts with the preferred doping concentrations. However, using the field plate structure of FIGS. 15 or 16, the reverse breakdown voltage can be substantially increased. Referring back to FIG. 11, the boron implantation which forms the P region 1106 is followed by a temperature cycle which vertically and laterally diffuses the well region 1106. Because the left edge of the boron implant can be self-aligned to the field plate 1103, the underlap of the P− region 1106 is formed by the amount of lateral diffusion during the subsequent drive-in temperature cycle. The doping concentration profile resulting from a thermal diffusion is gaussian, thus the concentration of carriers decreases with lateral distance by a factor proportional to $\exp{-x^2/(2\sigma_x^2)}$ where x is the lateral distance and $\sigma_x$ is the standard deviation of the lateral diffusion distance of a carrier during the thermal diffusion cycle. Furthermore, in contrast to the structure of FIG. 6, no heavy body implantation is performed under the gate pad 404 or the field plate 1103.

Referring to FIG. 15, the carrier concentration in the region of the well 1106 underlying the field plate 1103 can be much lower than the carrier concentration in the right edge of the P− region 602 illustrated in FIG. 6. As a result of the low carrier concentration of the P− region 1106 underneath the field plate 1103, the electric field strength is lower for a given reverse bias voltage in the depletion region of the P side 1505 of the zener diode junction formed by the N+ region 1402 and the P− region 1106 in comparison to the structure of FIG. 6. Because the electric field strength is less, the zener breakdown voltage of the structure in FIG. 15 is higher than the structure of FIG. 6. Therefore, by suitable selection through process conditions, the carrier concentration in the P depletion region 1505 is controlled according to this embodiment of the present invention, and the zener breakdown voltage is thereby controlled.

A second significant controllable attribute of the field plate is its length. The length of the field plate influences the carrier concentration in the P− region 1504 illustrated in FIG. 15. The boron dopant in the P− region 1504 diffused from the P− body regions 1105 and 1106. Assuming the regions 1105 and 1106 were formed by the same implantation, the carrier concentration is the least at the center of the region 1504 beneath the field plate because the carrier concentration under the field plate is essentially the sum of two gaussian functions of the distances from the polysilicon field plate 1103 edges.

Because resistance through doped semiconductor diffusion is proportional to the doping concentration, the lightly doped P− region 1504 is relatively high in resistance. The effect of the high resistance across the region 1504 provides one of the most important features of the structure according to the present invention: the snap back of the current-voltage characteristic of the zener diode when reverse breakdown occurs as illustrated by the i-v characteristic in the first quadrant shown in FIG. 9.

Figure 17:
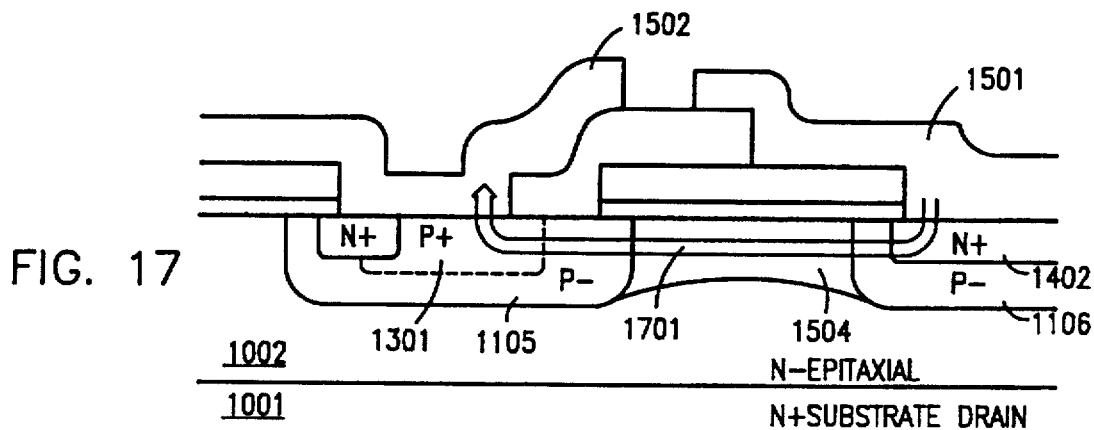
FIG. 17 illustrates the current flow in the embodiment of the present invention implementing the characteristic shown in FIG. 9 just after reverse breakdown of the gate protection zener diode.
Figure 18:
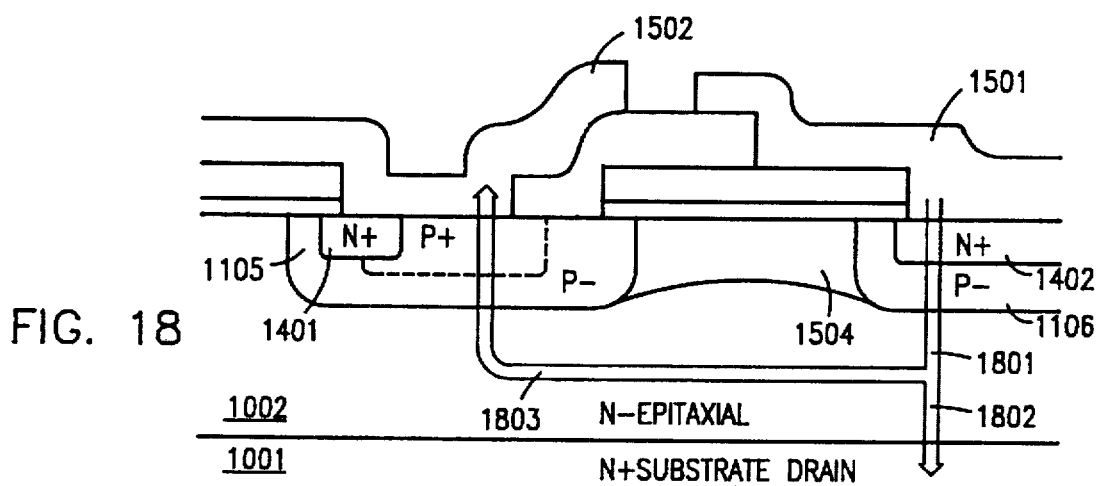
FIG. 18 illustrates the current flow in the embodiment of the present invention implementing the characteristic shown in FIG. 9 after snap back occurs.
Figure 19:
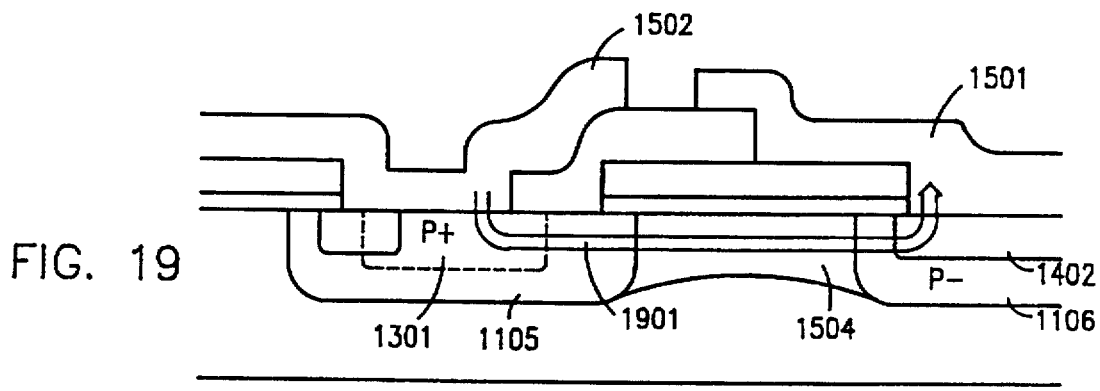
FIG. 19 illustrates the current flow in the embodiment of the present invention implementing the characteristic shown in FIG. 9 when a negative gate-source voltage is applied.

The mechanism by which the "snap back" of the i-v characteristic occurs will be discussed with reference to FIGS. 17, 18, and 19. FIGS. 17, 18, and 19 illustrate a field plate structure that is electrically connected to the gate pad metal. However, as discussed above, there is no requirement that the field plate be connected to anything in particular or anything at all. As a voltage is applied across the gate pad 1501 and the source metal 1502, the size of the depletion region in the P− side of the N+P− zener diode formed by the N+ region 1402 and the P− region 1106 increases. Before breakdown, the applied voltage v is essentially entirely across the junction between the N+ region 1402 and the P− region 1106.

Referring to FIG. 9, at some positive gate-source voltage Vz, zener breakdown occurs, and a positive current begins to flow, as illustrated in FIG. 17 by the current arrow 1701 which passes from the gate pad 1501 through the N+ zener cathode 1402 through the P− region 1106, the P− region 1504, the P− region 1105, the heavy body contact 1301, and into the source metal 1502. The highest resistance region in which the current 1701 flows is the P− region 1504, because of its low carrier concentration and length. Because of the high resistance facing the current 1701, the majority of the voltage drop Vz now occurs across the region 1504. When the zener diode begins conducting, the voltage of the P− region near region 1402 increases and this determines the onset of thyristor action.

Referring to FIG. 18, when the voltage of the P− region 1106 increases after conduction begins, the diode formed by the P− region 1106 and the N− epitaxial drain region 1102 becomes forward biased, thereby diverting the current 1701 to the path 1801 illustrated in FIG. 18. Once the current 1801 is in the N− epitaxial layer 1002, a portion of the current 1802 goes into the N− substrate 1001 while the remainder of the current 1803 passes through the N− epitaxial layer 1002 through the P− body region 1105 through the P+ body region 1105 and into the source metal 1502. As illustrated in FIG. 9, the current 1801 (Iz) is much greater than the current 1701 (Is), even though the gate-source voltage is the same (Vz). This is a consequence of the fact that while the current 1801 travels into the N− epitaxial region rather than through the P− region 1504, the current increases greatly, the i-v characteristic of the structure is as illustrated in FIG. 9 above the current level Is. In other words, the parallel resistances into the N+ substrate 1001 (current path 1802) and through the N− epitaxial layer 1002, the P− body 1105, the N+ source 1401, and the source metal 1502 (current path 1803) are much less than the resistance through the P− region 1504. Referring back to FIG. 7, after the zener diode breaks down, the bipolar transistor essentially begins conducting in the reverse direction.

After the snap back occurs, the zener diode 801 in FIG. 8 conducts current at a high rate with little power dissipation until the ESD event passes. In the case that the ESD event is a charged human body, eventually the capacitance of the human body is discharged and the diode turns off. Thus, the zener diode gate protection structure according to an embodiment of the present invention behaves much like a thyristor.

By this mechanism, the peak voltage induced by the ESD event is reduced considerably by the grounding effect of the thyristor action.

The charge of the human body is essentially a random variable. In the event that a large negative voltage is applied to the gate of the power device, the zener diode 801 in FIG. 8 simply becomes forward biased and discharges the capacitance. Referring to FIG. 19, when the voltage on the gate pad 1501 becomes negative, the current 1901 passes from the source metal 1502 through the P+ heavy body contact region 1301, the P− body region 1105, the P− region 1504, the P− region 1106, the N+ region 1405, and into the gate pad metal 1501. As illustrated in the third quadrant of the current vs. voltage plot of FIG. 9, the forward biased diode turns "on" at approximately 0.6 to 0.8 Volts; however, instead of demonstrating a classic exponential current vs. voltage relationship, the resistance of all the circuit elements (most notably the resistance of the P− region 1504) causes the current vs. voltage curve to exhibit a rather linear slope.

The present invention has been described above with reference to an N channel MOS device. However, the present invention also includes P channel MOS devices and methods for fabricating them.

While the present invention has been disclosed with particular reference to its preferred embodiments, those embodiments are presented by way of example, not by way of limitation. Those of ordinary skill in the art would be enabled by this disclosure to add to or modify the embodiments of the present invention in various ways as needed and still be within the scope and spirit of various aspects of the present invention as recited in the appended claims. Accordingly, various changes and modifications which are obvious to a person skilled in the art to which the invention pertains are deemed to lie within the spirit and scope of the invention.

What is claimed is:

1. An overvoltage protection device for an input of a semiconductor device, comprising:

a substrate of a first conductivity type;

a body region of a second conductivity type within the substrate;

an input pad body region of a second conductivity type within the substrate;

a heavy body contact region of a second conductivity type within the body region having a higher doping concentration than the body region;

a source region of the first conductivity type within the body region having a higher doping concentration than the body region;

a zener cathode region of the first conductivity type within the input pad body region having a higher doping concentration than the input pad body region;

a field plate overlying the substrate and partially overlapping the body region and the input pad body region; and a gate oxide layer between the field plate and the substrate.

2. The overvoltage protection device for an input of a semiconductor device as in claim 1, further comprising:

a gate pad metal layer overlying the substrate coupled to the zener cathode region.

3. The overvoltage protection device for an input of a semiconductor device as in claim 2, further comprising:

a source metal layer overlying the substrate coupled to the source region and the heavy body contact region.

4. The overvoltage protection device for an input of a semiconductor device as in claim 3, wherein the field plate partially overlaps the zener cathode region.

5. The overvoltage protection device for an input of a semiconductor device as in claim 4,
   wherein the field plate is made of polysilicon.

6. The overvoltage protection device for an input of a semiconductor device as in claim 5,
   wherein the gate pad metal layer is coupled to the field plate.

7. The overvoltage protection device for an input of a semiconductor device as in claim 5,
   wherein the source metal layer is coupled to the field plate.

8. The overvoltage protection device for an input of a semiconductor device as in claim 5,
   wherein the substrate comprises an epitaxial layer overlying a heavily doped semiconductor surface of the first conductivity type.

9. The overvoltage protection device for an input of a semiconductor device as in claim 5, wherein the first conductivity type is N-type and the second conductivity type is P-type.

10. The overvoltage protection device for an input of a semiconductor device as in claim 9, wherein the body region and the input pad body region have different doping concentrations.

11. The overvoltage protection device for an input of a semiconductor device as in claim 5, wherein the gate oxide layer is approximately 400 Angstroms thick.

12. The overvoltage protection device for an input of a semiconductor device as in claim 11, wherein the field plate is approximately 5,500 Angstroms thick.

* * * * *